United States Patent [19]
Taft

[11] Patent Number: 6,091,293
[45] Date of Patent: Jul. 18, 2000

[54] AMPLIFIER CIRCUIT HAVING AC RESET CAPABILITY AND METHOD

[75] Inventor: Robert Callaghan Taft, Munich, Germany

[73] Assignee: National Semiconductor Corporation, Santa Clara, Calif.

[21] Appl. No.: 09/277,531

[22] Filed: Mar. 26, 1999

[51] Int. Cl.$^7$ ........................................................ H03F 1/14
[52] U.S. Cl. .................................. 330/51; 330/9; 327/124
[58] Field of Search ............................ 330/9, 51; 327/124

[56] References Cited

U.S. PATENT DOCUMENTS

| | | | |
|---|---|---|---|
| 4,210,872 | 7/1980 | Gregorian | 330/9 |
| 4,438,354 | 3/1984 | Haque et al. | 307/493 |
| 5,084,639 | 1/1992 | Ribner | 307/490 |
| 5,880,630 | 3/1999 | Iwamoto et al. | 330/9 |

FOREIGN PATENT DOCUMENTS

| | | | |
|---|---|---|---|
| 59-154808 | 9/1984 | Japan | 330/9 |

*Primary Examiner*—Robert Pascal
*Assistant Examiner*—Henry Choe
*Attorney, Agent, or Firm*—Limbach & Limbach L.L.P.

[57] ABSTRACT

An amplifier circuit having a reset capability for use in analog-to-digital converter comparator stages and the like. First and second amplifier stages include first and transistor second switches, respectively, which are coupled between the amplifier inputs and outputs. A capacitor is coupled intermediate the output of the first amplifier stage and the input of the second amplifier stage. A third transistor switch is coupled between the output of the second amplifier stage and the output of the first amplifier stage. In an initialize state, a switch controller operates to render the first and second switches conductive and the third switch non-conductive. In a typical application, this will cause a charge to be stored on the capacitor indicative of any offset between the virtual grounds of the amplifier stages. In a reset state, the third switch is conductive and the first and second switches are made non-conductive. This causes the input and output of the second amplifier stage output to rapidly move from a potentially saturated state to an equilibrium state so that the second stage will be in condition for the next state, the amplify state. All three switches are non-conductive in the amplify state so that the amplifiers are, by way of example, either operating open loop or with some feedback impedance which provides a gain greater than unity.

19 Claims, 4 Drawing Sheets

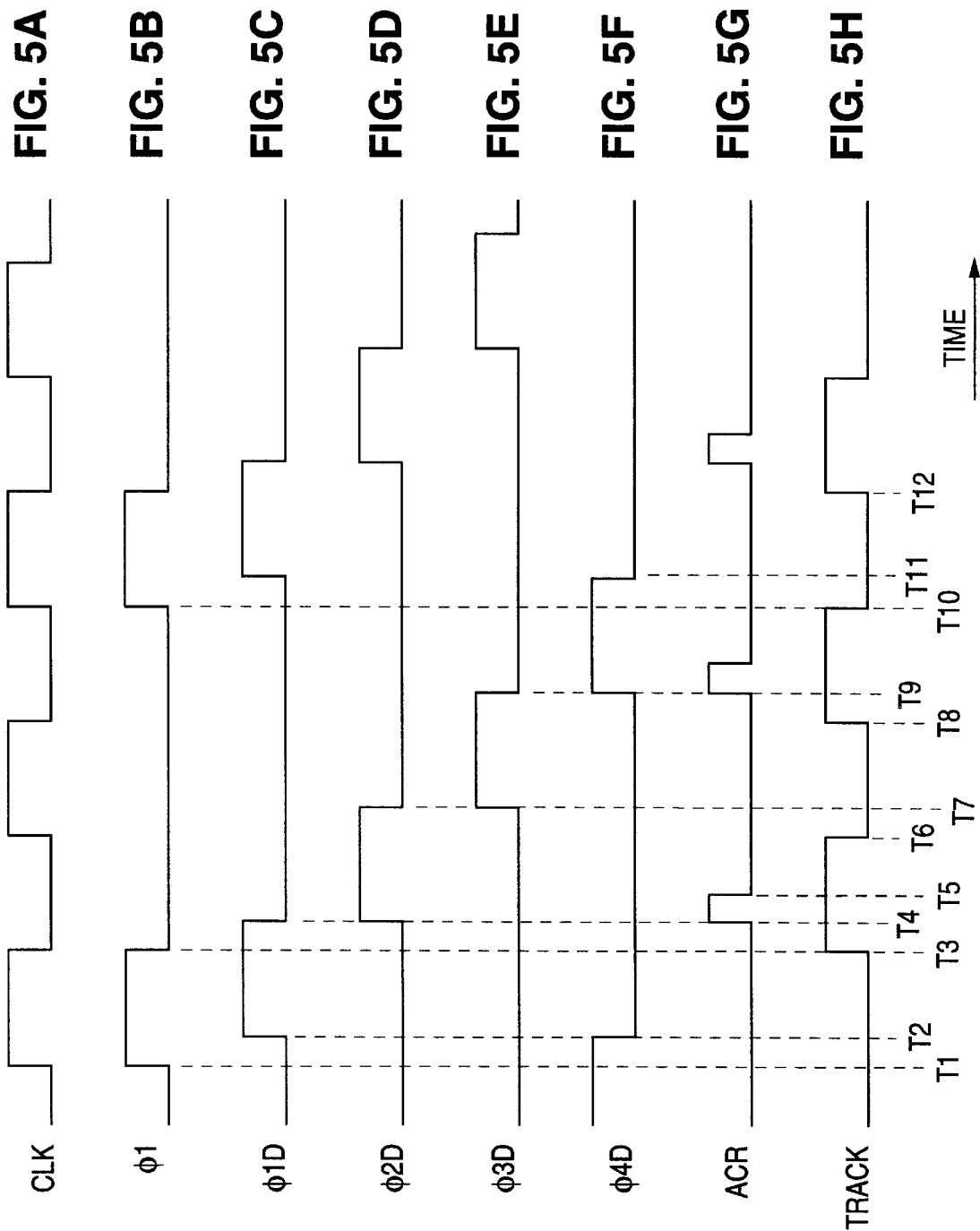

AMPLIFIER CIRCUIT HAVING AC RESET CAPABILITY AND METHOD

BACKGROUND OF THE INVENTION

1. Field of the Invention

The present invention pertains generally to electronic circuits and, in particular, to amplifier circuits having a capacitor input which can be reset without disturbing the charge on the capacitor.

2. Related Art

Various amplifier circuits have been developed that utilize input capacitor to store a charge related to a signal to be amplified. Such amplifier circuits are commonly used in Analog-to-Digital Converters (ADCs). Analog-to-Digital Converters (ADCs) are becoming more common due to reduced cost of implementing such converters and due to the increase in use of digital circuitry. There is a class of ADCs, sometimes referred to as subranging ADCs, that utilizes a reduced number of comparator banks in order to reduce the component count. One form of the prior art subranging ADC is shown in FIG. 1. ADC 10, which utilizes what is commonly referred to as a unified architecture, includes a reference resistor network 12 for producing a large number of reference voltages. Typically, network 12 will include a number of resistors connected in series between an upper reference voltage Vref$^+$ and a lower reference voltage Vref$^-$. These reference voltages are compared to an analog input Vin in order to determine the magnitude of Vin relative to each of the reference voltages. This relative magnitude information is used to generate the digital output of the ADC. For an eight bit ADC, fifteen major tap points are provided on the network which are evenly spaced so as to provide fifteen different coarse reference voltages $V_{RC}$. There are fifteen minor taps intermediate the major taps and intermediate the upper and lower reference voltages so as to produce a total of 240 fine reference voltages $V_{RF}$.

As previously noted, ADC 10 operates to compare an input Vin to be digitized with the coarse and fine reference voltages $V_{RC}$ and $V_{RF}$ to provide a digital output based upon the comparison. A comparator bank 14 is used to carry out the comparisons. There are a total of 255 reference voltages so that a total of 255 comparator circuits would be required if conventional flash ADC architecture were used. However, since a subranging ADC having a unified architecture is used, bank 14 has only 15 comparator circuits. One of the 15 comparator circuits, circuit 14A, is shown in FIG. 2. Each comparator circuit receives three inputs, including the analog input Vin to be measured, one of the 15 coarse reference voltage $V_{RC}$ and one of the 240 fine reference voltage $V_{RF}$. Switches S1A, S2 and S3 operate to sequentially connect one of the three inputs to the comparator circuits in accordance with the timing diagram of FIGS. 3A, 3B and 3C.

Comparator circuit 14A includes a pair of amplifiers 22 and 24 connected in series and driving a comparator/latch circuit 26 which provides a latched digital output. A capacitor C1 is connected in series between the input switches S1A, S2 and S3 and the input of amplifier 22. A second capacitor C2 is connected between the output of amplifier 22 and the input of amplifier 24.

Operation of ADC 10 begins with the closure of switches S1A, S1B and S1C as indicated by the waveform of FIG. 3A. Closure of switches S1B and S1C connect the respective outputs of amplifiers 22 and 24 to the respective inputs. This will cause each of the amplifier inputs to be set to the input threshold or virtual ground of the amplifiers so that a slight increase in input voltage will cause the inverting amplifier outputs to decrease and a slight decrease will cause the amplifier outputs to go higher. Capacitor C2 will hold a voltage equal to the difference in the threshold voltages of amplifiers 22 and 24. Capacitor C1 will hold a voltage equal to the difference in input voltage Vin and the threshold voltage of amplifier 22.

As shown in FIGS. 3A and 3B, switches S1A, S1B and S1C will open followed by closure of switch S2. It is standard procedure to open switch S1A after switches S1B and S1C have been opened. Note that since the input impedance of the amplifiers is high, there will be no change in charge on either capacitor C1 or C2. Switch S2 will connect the associated coarse reference voltage $V_{RC}$ to the input terminal of capacitor C1. Depending upon the magnitude of $V_{RC}$ relative to the input Vin, the voltage at the input of open loop amplifier 22 will increase above the threshold voltage or fall below the threshold voltage by an amount proportional to the difference in magnitude. This difference will be amplified by amplifier 22 and applied to the input terminal of capacitor C2. The amplified output will be applied to the input of amplifier 24. Since the charge on capacitor C2 is conserved, the input of amplifier 24 will increase above the threshold voltage of amplifier 24 or fall below the threshold voltage by an amount equal to the change in output of amplifier 22. Amplifier 24 will further amplify the difference voltage, with the output being coupled to a comparator/latch circuit 26. Comparator/latch circuit 26 will provide a compare operation and provide a digital output when strobed indicative of the magnitude of Vin relative to the associated coarse reference voltage $V_{RC}$.

During normal operation, Vin will fall somewhere between Vref$^+$ and Vref$^-$, with those comparator circuits having associated values of $V_{RC}$ greater than Vin producing a "1" output and those having an associated value of $V_{RC}$ less than Vin producing a "0" output. An encoder 18 converts the 15 digital outputs to provide the four MSBs of the ADC by way of a demultiplexer 20. The two adjacent comparator circuits 15 having digital outputs which transition from a "1" to a "0" will have associated values of $V_{RC}$ which bracket the magnitude of Vin. This means that input Vin falls somewhere within the range defined by the 15 fine reference voltages $V_{RF}$ which fall intermediate the two associated values of $V_{RC}$. Encoder 18 provides a control signal to multiplexer 16, causing the multiplexer to select the appropriate group of fine reference voltages $V_{RF}$ from the 16 groups of fine reference voltages.

Once the appropriate group of fine reference voltages $V_{RF}$ has been selected, multiplexer 16 will have connected one of the 15 different values of $V_{RF}$ to each of the 15 comparator circuits 14A. There is a delay between the opening of switch S2 and the closure of switch S3, as indicated by FIGS. 3B and 3C, to provide time for the compare operations to take place. The charge on capacitors C1 and C2 will have remained unchanged, with the charge on capacitor C1 continuing to be the difference between Vin and the input threshold voltage of amplifier 22. Accordingly, the output of amplifier 24 will reflect an amplified difference in magnitude between Vin and the selected fine reference voltage $V_{RF}$. Latch circuit 26 will store a digital value which corresponds to the amplified difference. Encoder 18 will encode the 15 different latch outputs and provide 4 bits which will correspond to the 4 LSBs of the ADC thereby concluding the conversion for one value of Vin.

The unified architecture of FIG. 1 is capable of providing a relatively large number of bits of resolution using a small number of comparator circuits. Thus, the cost of manufacturing the ADC is reduces, as is the power consumption.

However, the unified architecture has certain drawbacks, one of which relates to the speed of operation.

There is an increased demand for higher speed operation of ADCs while maintaining a low component count. The present invention permits higher speed operation of ADCs utilizing the unified architecture while still maintaining the advantages inherent in the architecture. This and other advantages of the present invention will become apparent to those skilled in the art upon a reading of the following Detailed Description of the Invention.

SUMMARY OF THE INVENTION

An amplifier circuit suitable for use in a subranging ADC having a unified architecture is disclosed. The amplifier circuit includes first and second amplifier stages, each having an input and an output. A first capacitor is coupled to the input of the second amplifier stage and a first node. In one embodiment, the output of the first amplifier stage is permanently coupled to the first node and in a second embodiment, the output is coupled by way of a transistor switch.

A first transistor switch is coupled between the input and output of the first amplifier stage and a second transistor switch is coupled between the input and output of the second amplifier stage. A third transistor switch is coupled between the output of the second transistor stage and the first node.

The states of the various switches are controlled by a switch controller operable to switch the amplifier circuit among an initialize state, a reset state and an amplify state. In the initialize stage, the first and second transistors switches are in a conductive state and the third transistor switch is in a non-conductive state. Assuming, for example, if the amplifier stages are inverting amplifiers, this operation will cause the inputs and outputs of both amplifiers to go to virtual ground values. Any difference in virtual ground values will be stored as a charge on the first capacitor.

When the amplifier circuit switches to the reset state, the first and second transistor switches are made non-conductive and the third transistor switch is made conductive so that the first node and the output of the second amplifier stage are connected together. Under certain conditions, it may be preferable to isolate the output of the first amplifier stage from the first node. This operation will reset the second amplifier stage so that the first node and the second amplifier stage output will rapidly go to some midrange level. Thus, if the second amplifier stage had been in saturation from a previous measurement or because of some disturbance, the amplifier stage will be reset back to an active region in preparation for the amplify state. This reset operation does not disturb the charge on the first capacitor.

In the amplify state, the first, second and third transistor switches are made non-conductive. Both amplifiers are then capable of carrying out amplification of an input signal at this time. In a typical ADC application, the analog input signal is applied to the subject amplifier circuit during the initialize state and a reference voltage is applied during the amplification state so that a signal indicative of the difference between the input signal and the reference signal will be produced at the output of the second amplifier state.

BRIEF DESCRIPTION OF THE DRAWINGS

FIGS. 5A–5H are timing diagrams illustrating the operation of the FIG. 4 converter circuit.

DETAILED DESCRIPTION OF THE INVENTION

Figure 1:
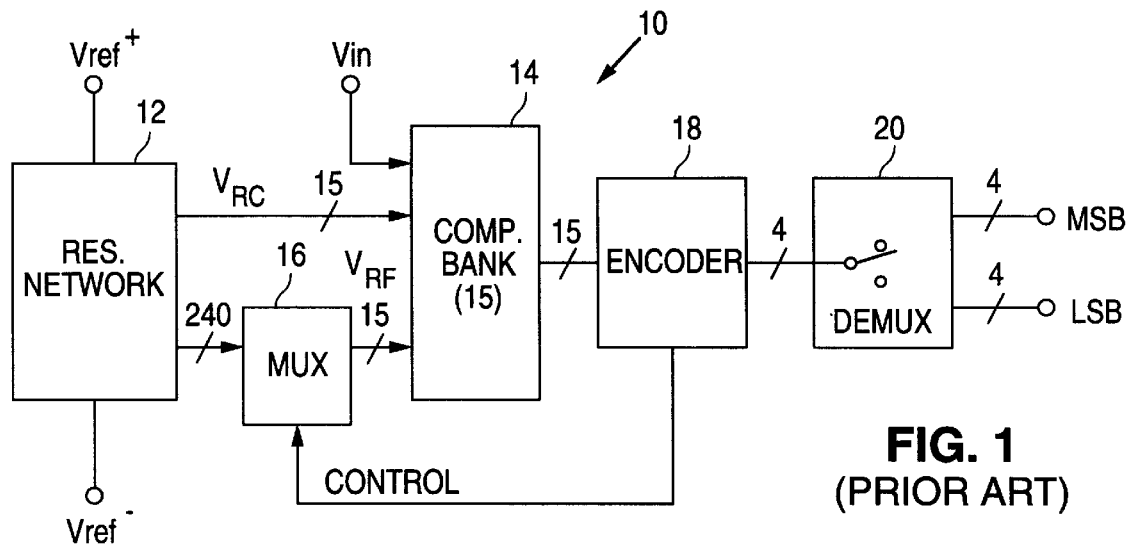
FIG. 1 is a block diagram of a prior art analog-to-digital subranging converter which utilizes a unified architecture.
Figure 2:
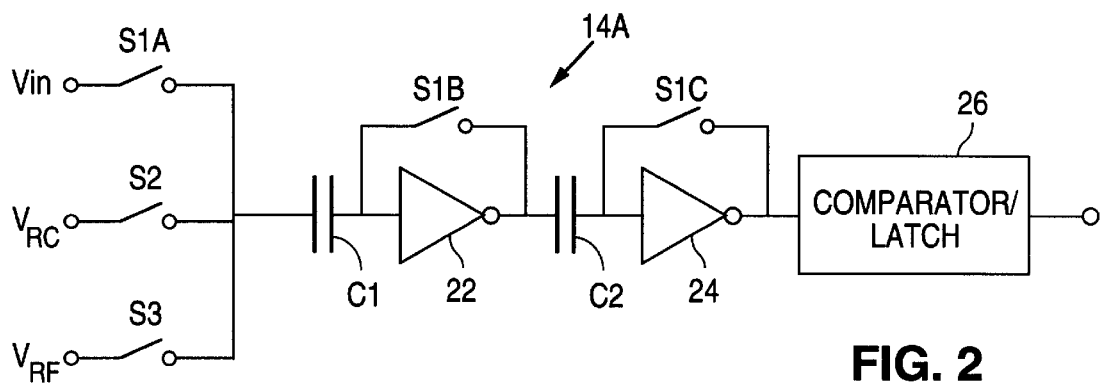
FIG. 2 is a diagram of a prior art comparator circuit used in the FIG. 1 converter.
Figure 3A:
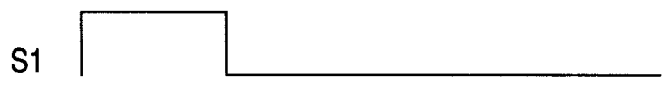
FIGS. 3A, 3B and 3C are timing diagrams illustrating the operation of the FIG. 1 converter.
Figure 3B:
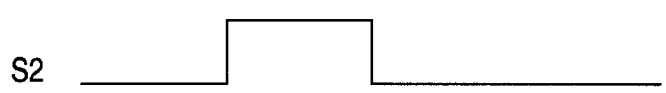
Figure 3C:
Figures 4, 6:
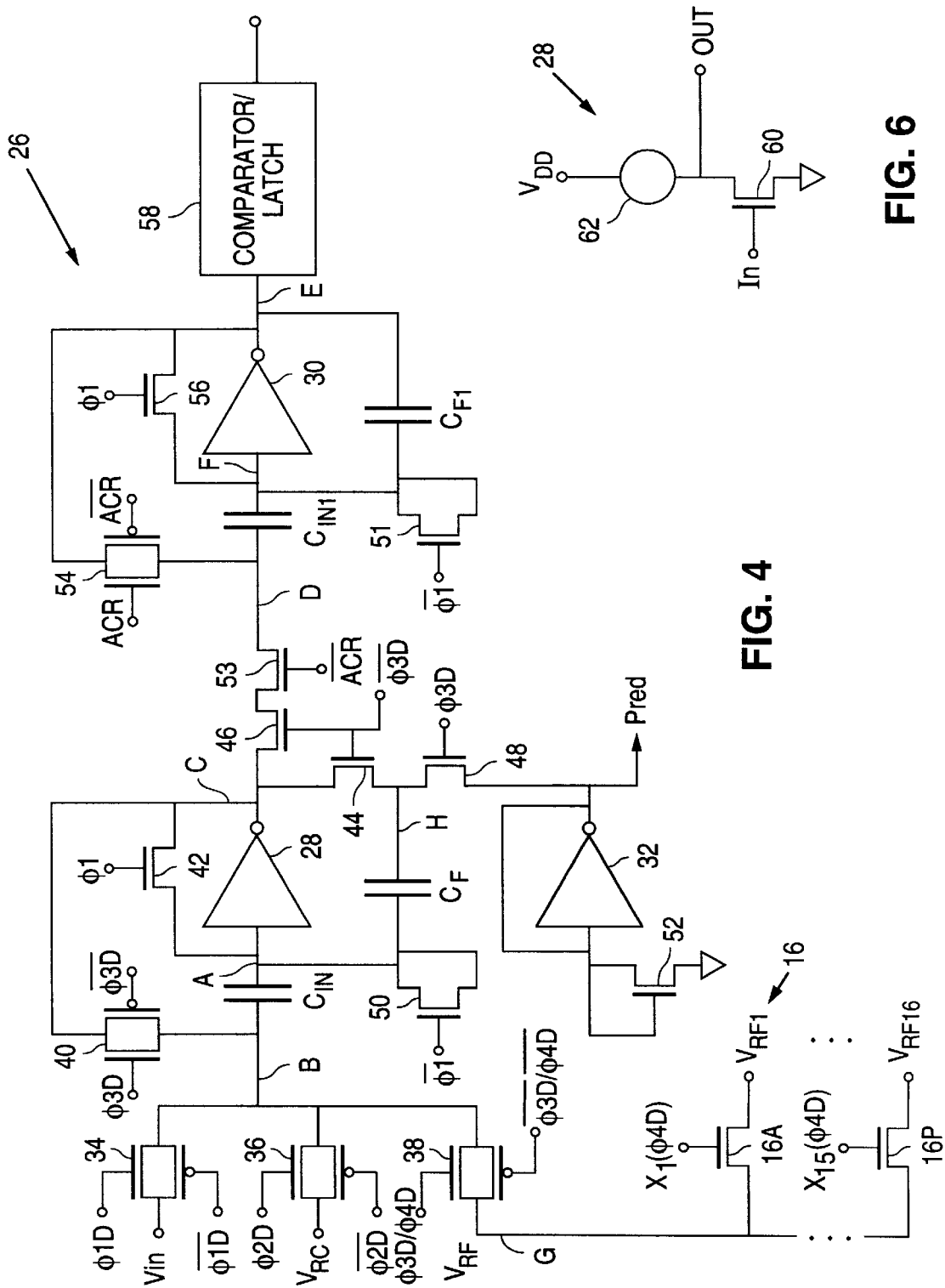
FIG. 4 is a diagram of a converter circuit having a amplifier which incorporates the AC reset feature in accordance with the present invention.
FIG. 6 is a simplified schematic diagram of the amplifiers used in the FIG. 4 converter circuit.

Referring again to the drawings, FIG. 4 is a diagram of a comparator circuit 26 in accordance with the present invention suitable for use in a subranging ADC using unitary architecture such as shown in FIG. 1. Thus, with a minor exception to be described, the FIG. 4 comparator circuit 26 will be duplicated 15 times to make up a full comparator bank 14 as shown in FIG. 1. As will be explained in greater detail, comparator bank 26 is preferably implemented in a pseudo differential manner rather than the single-ended implementation show in FIG. 4.

The comparator circuit 26 includes a first inverting amplifier 28 having an input at node A connected to an input capacitor Cin. The remaining terminal of capacitor Cin is connected at a node B to three sets of input switches 34, 36 and 38, sometimes referred to as transmission gates. Each transmission gate includes a parallel connection of a P and an N type MOS transistor which are switched between states by complementary signals so that one or both transistors can be made conductive over a relatively wide range of input voltages. The transistor switches that are connected to the inputs of the various amplifiers operate near virtual ground so that such switches can be implemented using a single N type transistor rather than a transmission gate.

Transmission gate 38 is connected to the output of multiplexer 16 which includes one transistor switch associated with each of the 240 different values for the fine reference voltages $V_{RF}$. Each of the 15 comparator circuits 26 can potentially receive 16 of those reference voltages $V_{RF1}$ through $V_{RF16}$. Thus, 16 of the multiplexer switches are connected to each comparator circuit, including transistor switches 16A through 16P having a common terminal connected to a node G of comparator circuit 26 and separate terminals connected to respective fine reference voltages $V_{RF1}$ through $V_{RF16}$.

A fourth transmission gate 40 is connected between the output of amplifier 28 at node C to node B. A single transistor switch 42 is connected between the amplifier input (node A) and the amplifier output (node C). A feedback capacitor $C_F$ is connected directly to the amplifier 28 input (node A) and to the amplifier output (node C) by way a transistor switch 44. As will be described in greater detail, a circuit which produces a predictor signal Pred has an output connected to one terminal of feedback capacitor $C_F$ by way of a transistor switch 48.

The second stage of comparator circuit 26 is an amplification stage connected to the previous stage by way of a transistor switches 46 and 53. The second stage includes an amplifier 30 having an input (node F) connected to one terminal of an input capacitor $C_{IN1}$ and to one terminal of a feedback capacitor $C_{F1}$. The output of amplifier 30 (node E) is connected to a second terminal of capacitor $C_{F1}$ and is connected to the amplifier input (node F) by way of a transistor switch 56. The amplifier output is also connected to a node D by way of a transmission gate 54. Although shown implemented as a transmission gate, it is possible to implement switch 54 using a single N type transistor since the threshold voltages (virtual ground) of the amplifiers 28 and 30 are typically around +0.7 volts. The second stage output is connected to a comparator/latch circuit 58 which converts the output of the second stage to a digital output and holds the digital output for a controlled time period.

FIGS. 5A–5H are timing diagrams illustrating the operation of the FIG. 4 comparator circuit in the context of a subranging ADC such as shown in FIG. 1. FIG. 5A is a clock signal CLK which forms the basis for the remaining signals. Signal φ1 controls transistor switches 42 and 56 and goes high at the beginning of a conversion cycle starting at time T1. When φ1 becomes active, switches 42 and 56 turn on thereby connecting the input and output of amplifier 28 together and the input and output of amplifier 30 together. As previously described in connection with FIG. 1, this will cause nodes A and C to be set to the threshold voltage of amplifier 28 and will cause nodes F and E to be set to the threshold voltage of amplifier 30.

FIG. 6 is a simplified diagram of amplifiers 28 and 30, with the amplifiers including an input MOS transistor 60 in a common source configuration with a current source load 62. When the amplifier input is connected to the output, as during φ1, transistor 60 is diode-connected with the gate and drain being at the threshold voltage of the transistor.

Returning to FIG. 4, transistor switches 44 and 46 are driven by $\overline{\phi3D}$ (the complement of φ3D), with the complement being active at this time as indicated by FIG. 5E. Similarly, transistor switch 53 is driven by $\overline{ACR}$ (the compliment of ACR), with the compliment being active at this time as indicated by FIG. 5G. Accordingly, the output of amplifier 28 (node C) is connected to node D by way of on switch 46 and switch 53. Thus, both amplifiers 28 and 30 have inputs/outputs at their respective threshold voltages, with capacitor $C_{IN1}$ having a voltage drop equal to the difference between the two threshold voltages.

A short time after φ1 goes active at time T1, φ1D goes active, as indicated by the waveform of FIG. 5C, at time T2. This will cause transmission gate 34 to turn on thereby connecting input Vin to the input terminal (node B) of capacitor $C_{IN}$. Thus, the voltage drop across capacitor $C_{IN}$ will be equal to the difference between Vin and the threshold voltage of amplifier 28. The voltage across $C_{IN1}$ will remain equal to the difference in threshold voltages of amplifiers 28 and 30. As will be explained in greater detail, the charges on capacitors $C_{IN}$ and $C_{IN1}$ are retained throughout the remainder of the conversion cycle.

At time T3 when φ1 goes inactive, transistor switches 42 and 56 turn off. The drive signal to the two transistor switches will be capacitively coupled to nodes A and F by way of the transistor gate capacitances and will tend to alter the charge on capacitors $C_{IN}$ and $C_{IN1}$. Transistors 50 and 51 are connected to nodes A and F, respectively, and are both driven by $\overline{\phi1}$ so that an equal but opposite polarity charge is introduced at nodes A and F to cancel the charge introduced by transistor switches 42 and 56 when they are turned off. Note that compensation transistors 50 and 51 may not be needed if the prefered differential implementation is used.

As indicated by the waveform of FIG. 5B, φ1 goes low (inactive) at time T3 followed by φ1D going low at time T4. This will cause a staged opening of switches 42 and 56 followed by the opening of switch (transmission gate) 34 to ensure that large switch 34 does not open prior to opening of the smaller switches 42 and 56. As will be explained later, amplifier 30 will go through a reset sequence starting at time T4 as a result of an AC reset signal (FIG. 5G) going active. The reset takes only a small time period and is over at time T5.

At this point in the conversion cycle, amplifiers 28 and 30 both operate in a closed loop configuration. Amplifier 28 has an input capacitor $C_{IN}$ and a feedback capacitor $C_F$ and amplifier 30 having an input capacitor $C_{IN1}$ and a feedback capacitor $C_{F1}$. The closed loop gain of inverting amplifiers 28 and 30 are thus equal to $-C_F/C_{IN}$ and $-C_{F1}/C_{IN1}$, respectively. The capacitor ratios are typically selected to give a closed loop gain of approximately 2. In one implementation, capacitors $C_{IN}$, $C_F$, $C_{IN1}$, and $C_{F1}$, are 150 fF ($10_{-15}$ Farads), 75 fF, 120 fF and 40 fF, respectively.

As indicated by FIG. 5H, at time T3, signal TRACK goes active which causes comparator/latch circuit 58 to begin sensing the output of amplifier 30. At time T4 when φ2d goes active, transmission gate 36 is switched on thereby connecting the one value of $V_{RC}$ associated with the comparator circuit 26 to node B. The change in voltage at node B between Vin and $V_{RC}$ will be amplified by two by amplifier 28 and again by two by amplifier 30.

At time T6, when the output of amplifier 30 has had an opportunity to settle to a final value representing the amplified difference between Vin and $V_{RC}$, signal TRACK goes inactive, with the amplifier 30 output being sampled at that time by comparator/latch circuit 58. Once the 15 different comparator/latch circuits 58 have completed the compare operation, encoder 18 (FIG. 1) will encode the outputs and provide the 4 MSBs of the ADC. Eventually, at time T9, a control signal will be produced causing multiplexer 16 to begin switching so that the appropriate group of 15 values of $V_{RF}$ will be connected to the 15 comparator circuits 26 (FIG. 4) of the comparator bank 14.

When signal TRACK goes inactive at time T6, the outputs of amplifiers 28 and 30 have been sampled and will not be used to measure the fine reference voltage $V_{RF}$ until time T9 when signal φ4D (FIG. 5F) goes active. During the interim and starting at time T7 when signal φ3D goes active, amplifier 28 and the associated circuitry operate to precharge the bus output of multiplexer 16 (node G) to a voltage which will be in the same range as that of the 15 values of $V_{RF}$ that will eventually be selected by multiplexer 16.

The 16 transistor switches 16A through 16P of multiplexer 16 that are connected to node G create a substantial capacitance at the node. A similar number of different multiplexer switches are connected to the remaining 14 other amplifier circuits. At time T9 when φ4D goes active, a selected one of the 16 transistor switches will begin to turn on and will connect one of fine reference voltage $V_{RF1}$ through $V_{RF16}$ to node G. Depending upon the actual value of Vin, the fine reference voltages could potentially be at any voltage intermediate Vref$^+$ and Vref$^-$. Thus, unless the precharge operation is carried out to charge the bus output of the multiplexer, a large amount of time could be required for node G to reach the proper voltage. This would substantially reduce the operating speed of the ADC.

The precharge operation begins at time T7 when signal φ3D goes active. Transmission gate 38 is turned on thereby connecting node B to the highly capacitive node G. Transistor switch 46 is turned off thereby disconnecting the output of amplifier 28 from the input of amplifier 30. In addition, switch 44 turns off and switch 48 turns on thereby disconnecting one terminal of feedback capacitor $C_F$ from the output of amplifier 28 and connecting the terminal of the capacitor (node H) to the source of a signal Pred. Signal Pred is provided to each of the 15 comparator circuits 26 of the comparator bank and is set to a voltage which approximates the threshold voltage of the amplifiers 28. Thus, one terminal of the feedback capacitor is connected to the input of amplifier 28 (node A) and the remaining terminal (node H) is connected to signal Pred.

Transmission gate 40 will operate to connect the output of amplifier 28 (node C) to node B and, by way of transmission gate 38, to node G. The resultant negative feedback will cause amplifier 28 to drive nodes B (and G) to whatever voltage is necessary to maintain the amplifier input (node A) near the threshold voltage of the amplifier. Assuming that signal Pred and the input threshold voltage of amplifier 28 are nearly the same, the voltage at nodes A and H will be the same. Thus, the voltage across capacitor $C_F$ will be close to 0 volts. Any charge that was present on capacitor $C_F$ will be transferred to capacitor $C_{IN}$ since the two capacitors are effectively connected in series and since the input impedance of amplifier 28 is high. When signal φ2d previously went active starting at time T2, the voltage across capacitor $C_F$ was 0 volts and node B was at voltage Vin. When node B was switched to voltage $V_{RC}$, a predetermined charge was transferred from capacitor $C_{IN}$ to capacitor $C_F$. Now, at a time starting T7, the amplifier output will drive node B so that same charge that had been transferred from $C_{IN}$ to $C_F$ will be transferred from $C_{IN}$ back to $C_F$. Thus, the same conditions will exist as they did at time T3, with the voltage at nodes B and G being driven to Vin. The capacitance seen at node B due the presence of the multiplexer bus (transistors 16A through 16P) will be precharged by the output of amplifier 28 to a voltage (Vin) that will have a magnitude in the same range as that of the 15 different values of $V_{RF}$ selected by multiplexer 16. Thus, the amount of time required to alter the voltage at nodes B and G from Vin to the particular value of $V_{RF}$ applied to the comparator circuit 14A will be greatly diminished as compared to the time if no precharge had taken place.

A single circuit is used to produce signal Pred for all 15 comparator circuits used in the comparator bank 14. That circuit includes an amplifier 32 of the same construction as amplifier 28 and having the input and outputs permanently connected together. Thus, the amplifier 32 output will be at the threshold voltage of the amplifier. A diode-connected transistor 52 is connected between the amplifier 32 input and has a geometry relative to that of the input transistor 60 (FIG. 6) so threshold voltage of transistor 52 is slightly lower than that of the input transistor. Transistor 52 will thus slightly reduce the value of voltage Pred. Typically, the magnitude of signal Pred will be reduced by about 50 millivolts. This is to compensate for parasitic capacitance (Miller capacitance) that always is present between the input and output of amplifier 28 (between the gate and drain of transistor 60 of FIG. 6). This capacitance is not disconnected by transistor switch 44 so that when node H is connected to signal Pred, not all of the charge transferred from input capacitor to capacitor $C_F$ and to the parallel parasitic capacitor is transferred back to capacitor Cin during precharge. This typically results in an error in the magnitude of the precharge voltage applied to node B by a small value, such as 5 millivolts. Although this error is small, the reduction in the magnitude of signal Pred by 50 millivolts effectively eliminates the error for values of Vin midway between $Vref^+$ and $Vref^-$ and greatly reduces even this small error at other values of Vin. $Vref^+$ and $Vref^-$ are typically +3.5 volts and +1.5 volts, respectively. Returning to the FIG. 5E, when signal φ3D goes inactive at time T9, nodes B and G are precharged to voltage Vin. Capacitor $C_F$ is reconnected between the amplifier 28 input and output. Depending upon the previous comparison between Vin and $V_{RC}$, a selected one of multiplexer switches 16A through 16P will begin to turn on starting at time T9 so that switch 38 and selected switch 16A through 16P will connect the appropriate value of $V_{RF}$ to node G so that nodes G and B will move from the approximated value of Vin to $V_{RF}$.

Note that none of the previous steps in the conversion process will have permanently altered the charge present on capacitor $C_{IN}$ that was placed there when φ1D was active. Thus, the charge on capacitor $C_{IN}$ continues to be indicative of the magnitude of Vin. Further, the charge present on capacitor $C_{IN1}$ during the same period which is related to the difference between the threshold voltages of amplifiers 28 and 30 will have remained unchanged.

Any difference between Vin and $V_{RF}$ will be amplified by two, that being the closed loop gain of amplifier 28. The amplified difference voltage will be further amplified by amplifier 30. At time T10, signal TRACK goes inactive thereby causing the comparator/latch circuit 58 to sample the state of the output of amplifier 30. The state of the amplifier 30 output will be indicative of the relative magnitude of Vin and the associated fine reference voltage $V_{RF}$. Note that signal TRACK goes low at T10 slightly before φ1 goes high so that, for example, switches 42 and 56 will not turn on and thereby disturb the signal being measured by the comparator/latch circuit 58. Once the final comparison is made, the 15 comparator/latch circuit 58 outputs are encoded to produce the 4 LSBs of the ADC. A new measurement or conversion cycle then begins to take place at time T10 when signal φ1 goes active.

When the 15 comparator circuits 26 of comparator bank 14 perform a comparison, the difference between Vin and the associated 15 values of the coarse reference voltages $V_{RC}$ will be relatively large for most of the circuits. The same is true, to a somewhat lesser extent, for the subsequent comparisons between Vin and the associated fine reference voltages $V_{RF}$. In most cases, this will result in the output of amplifier 30 being driven from its equilibrium value and in many cases becoming saturated, with the amplifier output being at either a maximum or a minimum value. Similarly, if the amplifier is subjected to some form of disturbance, the amplifier will be driven away from an equilibrium condition. In either case, the bandwidth of the amplifier will be low as compared to when the amplifier input is connected to the amplifier output as when signal φ1 is active. Thus, a substantial amount of time will be required for the amplifier outputs to settle to the final amplified values if appropriate steps are not taken.

Amplifier 30 is active when signal φ2D is high so that Vin can be compared to $V_{RC}$ and when φ4D is high so that Vin can be compared to $V_{RF}$. During a short time period at the beginning of the measurement period, amplifier 30 is subjected to a reset operation. At time T4, signal ACR goes active thereby connecting the amplifier 30 output (node E) to input node D by way of transmission gate 54. Inverse signal $\overline{ACR}$ will turn transistor switch 53 off thereby isolating node D from the output of amplifier 28. The negative feedback connection from node E to node D will provide two benefits. First, the slew rate of amplifier 30 will be greatly enhanced and will be significantly greater than the slew rate capability of the amplifier without the negative feedback. For example, if prior to the reset, the output at node E is high, the input at node D will be low due to inversion by amplifier 30. Thus, by shorting the high amplifier output at node E to the low amplifier input at node D, the two nodes will both be very rapidly driven in opposite directions towards the threshold voltage of the amplifier. The second advantage is that the short between nodes E and D greatly enhances the bandwidth of the amplifier thereby shortening the small signal settling time. It is important to note that when connecting nodes E and D together for the purpose of resetting the amplifier, the original charge on capacitor $C_{IN1}$ is preserved. Thus, the reset can be considered to be an AC reset as opposed to a DC reset which takes place when nodes F and E are connected together and the charge is lost.

As can be seen from FIG. 5G, the AC reset takes place twice during a conversion cycle, once beginning at time T4 in preparation for the measurement of $V_{RC}$ and once beginning at time T9 in preparation of the measurement of $V_{RF}$.

Figure 8A:
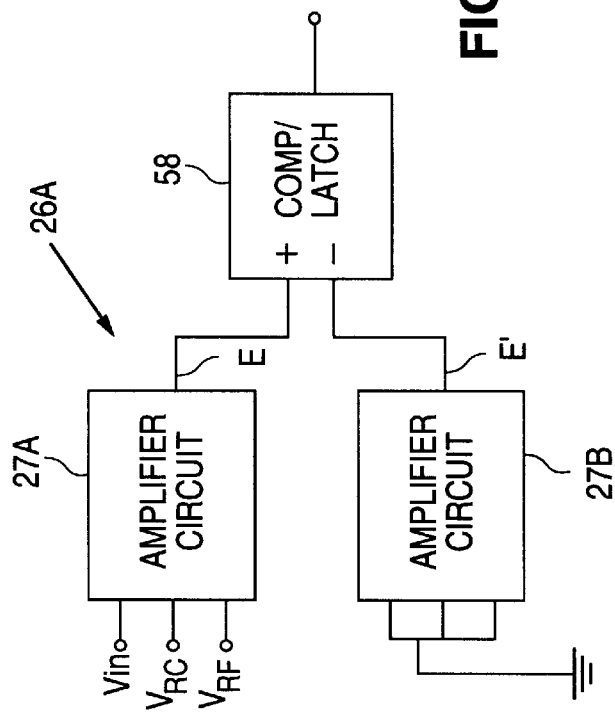
FIG. 8A is a simplified block diagram of the FIG. 4 converter circuit implemented in pseudo differential form.
Figure 8B:
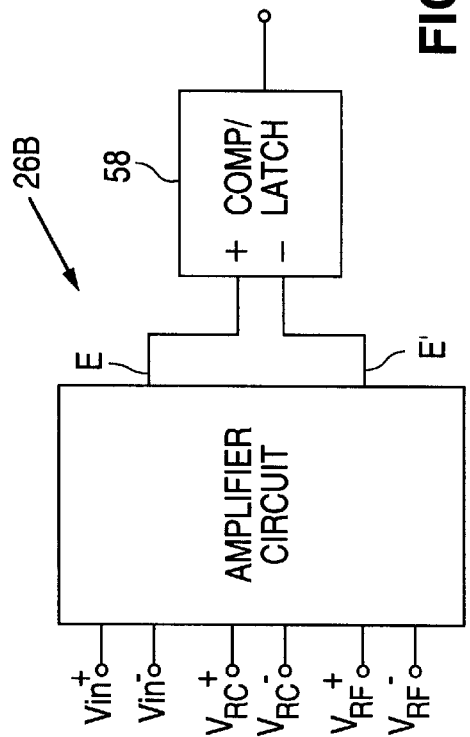
FIG. 8B is a simplified block diagram of the FIG. 4 converter circuit implemented in full differential form.

As previously noted, the comparator circuit of FIG. 4 is preferably implemented in a pseudo differential manner. FIG. 8A shows the pseudo differential implementation 26A for single ended inputs. Amplifiers 28 and 30 and the associated circuit form a differential half 27A which receive inputs Vin, $V_{RC}$ and $V_{RF}$ and provides a first component of a differential output at node E. A second differential half 27B, identical to half 27B in construction, provides a second component of the differential output at node E'. Switches 34, 36 and 38 of differential half 27B (not depicted) all receive a signal ground at the inputs rather than Vin, $V_{RC}$ and $V_{RF}$. Comparator/latch circuit 58 is implemented in a differential manner and provides a digital output indicative of the polarity of the differential signal input from differential halves 27A and 27B. The implementation is referred to a pseudo differential in that the amplifiers used in differential halves 27A and 27B are single-ended amplifiers as opposed to differential amplifiers. Errors introduced in one of the differential halves tend to offset one another. By way of example, at the end of the AC reset when transistor switch 54 is turned off at time T5, a small charge is injected at the input which results in a tail being produced at the amplifier output on node E. However, a tail of the same size and polarity will also be produced at node E' of differential half 27B. Since comparator/latch 58 responds to differential signals, the effect of the two tails will cancel one another.

FIG. 8A shows a fully differential implementation 26B. Rather than single ended inputs, the inputs are all differential, including Vin$^+$ and Vin$^-$, $V_{RC}^+$ and $V_{RC}^-$ and $V_{RF}^+$ and $V_{RF}^-$. In this fully differential implementation, amplifiers 28 and 30 must be implemented as differential amplifiers, with the associated circuitry further being modified for differential operation.

Figure 7:
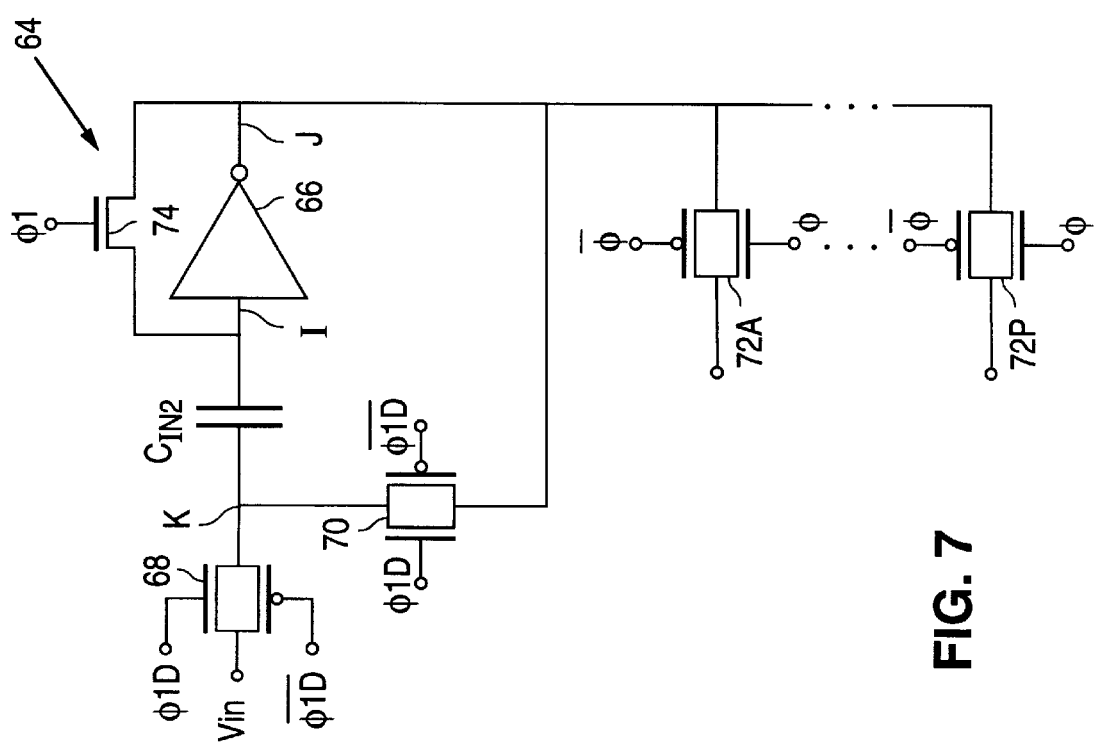
FIG. 7 is a schematic diagram of a dedicated pre-charge circuit suitable for use for carrying out a precharge function.

In some applications, it may be preferable to utilize a single precharge circuit for all 15 comparator circuits 26. In that event, the input amplifier 28 of each comparator circuit is not longer used to carry out the precharge. FIG. 7 depicts a precharge circuit 64 suitable for use in a subranging ADC having a unified architecture as disclosed in FIG. 1. The precharge circuit includes an inverting amplifier 66 similar to amplifier 28. A transistor switch 74 connecting between the amplifier input at node I and the amplifier output at node J. Switch 74 is controlled by signal φ1 as shown in FIG. 5B. An input capacitor $C_{IN2}$ is connected between the amplifier input and a transmission gate 68. Gate 68 is controlled by signal φ1D shown in FIG. 5C and the complement $\overline{φ1D}$. Since the dedicated precharge circuit 64 is not used to amplify $V_{RC}$ or $V_{RF}$, it is possible to initiate the precharge operation one phase earlier, at time T4, than in the previous implementation. This increase in operating speed is at the sacrifice of the increased power consumption of the dedicated precharge circuit 64.

Note that a charge injection results when switch 74 is turned off. This charge injection will tend to cause node I at the amplifier 66 input to drop in magnitude and thus will cause node J at the amplifier output to increase in amplitude. The Miller capacitance associated with amplifier 66, the effective capacitance between nodes I and J, will tend to reduce the output produced at node J. The size of transistor switch 74 is selected so that the charge injection closely offsets the effect of the Miller capacitance for an output at node J which falls intermediate Vref$^+$ and Vref$_-$.

Thus, a novel switched capacitor amplifier circuit has been disclosed which is suitable for use in subranging ADCs and other applications. Although various embodiments have been described in some detail, it is to be understood that various changes can be made by those skilled in the art without departing from the spirit and scope of the present invention as set forth in the appended claims. By way of example, it would be possible to eliminate switch 53 (FIG. 4) which operates to isolate the output of amplifier 30 from the output of amplifier 28 during AC reset. In that event, amplifier 30 should be implemented to have a drive capability somewhat greater than that of amplifier 28 so that amplifier 30 will be capable of driving node D to the desired level.

What is claimed is:

1. An amplifier circuit having a reset capability, said circuit comprising:
   first and second amplifier stages, each having an input and an output;
   a first capacitor having a first terminal coupled to the input of the second amplifier stage and a second terminal coupled to a first node, with the output of the first amplifier stage being coupled to the first node;
   a first transistor switch coupled between the input and output of the first amplifier stage;
   a second transistor switch coupled between the input and output of the second amplifier stage;
   a third transistor switch coupled between the first node and the output of the second amplifier stage; and
   a switch controller operable to switch the amplifier circuit to an initialize state, from the initialize state to a reset state and from the reset state to an amplify state, wherein in the initialize state, the first and second transistor switches are conductive and the third transistor switch is non-conductive, wherein in the reset state, the first and second transistor switches are non-conductive and the third transistor switch is conductive and wherein in the amplify state, the first, second and third transistor switches are non-conductive.

2. The amplifier circuit of claim 1 further including a second capacitor coupled between the input and output of the first amplifier stage and a third capacitor coupled between the input and the output of the second amplifier stage.

3. The amplifier circuit of claim 2 further including a fourth capacitor coupled between the input of the first amplifier stage and a second node.

4. The amplifier circuit of claim 3 further including a first and second signal sources, a fourth transistor switch coupled between the second node and the first signal source and a fifth transistor switch coupled between the second node and the second signal source and wherein in the initialize state, the fourth switch is conductive and the fifth switch is non-conductive and in the amplify state, the fourth switch is non-conductive and the fifth switch is conductive.

5. The amplifier circuit of claim 4 wherein the fifth transistor switch is conductive and the fourth transistor switch is non-conductive in the reset state.

6. The amplifier circuit of claim 3 further including first, second and third signal sources, a fourth transistor switch coupled between the second node and the first signal source, a fifth transistor switch coupled between the second node and the second signal source and a sixth transistor switch coupled between the third signal source and the second node and wherein reset state is referred to as a first reset state and wherein the switch controller is operable to switch the amplifier circuit from the amplify state, referred to as a first amplify state, to a second reset state, from the second reset state to a second amplify state and wherein in the initialize state, the fourth transistor switch is conductive and the fifth and sixth transistor switches are non-conductive, wherein the first amplify state the fifth transistor switch is conductive and the fourth and sixth transistor switches are non-conductive, wherein the second reset state, the first and second transistor switches are non-conductive and the third transistor switch is conductive and wherein in the second amplify state, the first, second, third, fourth and fifth transistor switches are non-conductive and the sixth switch is conductive.

7. The amplifier circuit of claim 1 further including a fourth transistor switch coupled between the output of the first amplifier stage and the first node and wherein in the initialize and amplify states the fourth switch is conductive and in the reset state the fourth switch in non-conductive.

8. A method of controlling the operation of an amplifier circuit which includes first and second amplifier stages, each having an input and an output, and a first capacitor having a first terminal coupled to the input of the second amplifier stage and a second terminal coupled to a first node, said method comprising:

setting the amplifier circuit to an initialize state by coupling the input of the first amplifier stage to the output of the first amplifier stage and to the first node and by coupling the input of the second amplifier stage to the output of the second amplifier stage;

setting the amplifier circuit from the initialize state to a reset state by coupling the output of the second amplifier stage to the first node; and setting the amplifier circuit from the reset state to an amplify state by decoupling the output of the second amplifier stage from the first node and by coupling the output of the first amplifier stage to the first node.

9. The method of claim 8 where the amplifier circuit further includes a second capacitor coupled between the input of the first amplifier stage and a second node and first and second signal sources, and wherein the setting of the amplifier circuit to the initialize state includes coupling the second node to the first signal source and wherein the setting to amplifier to the reset state includes coupling the second node to the second signal source.

10. An amplifier circuit having a reset capability, said circuit comprising:

first and second amplifier stages, each having an input and an output;

a first capacitor having a first terminal coupled to the input of the second amplifier stage and a second terminal coupled to a first node, with the output of the first amplifier stage being coupled to the first node;

a first transistor switch coupled between the input and output of the first amplifier stage;

a second transistor switch coupled between the input and output of the second amplifier stage;

a third transistor switch coupled between the first node and the output of the second amplifier stage; and a switch controller operable to switch the amplifier circuit among an initialize state, a reset state and an amplify state, wherein in the initialize state, the first and second transistor switches are conductive and the third transistor switch is non-conductive, wherein in the reset state, the first and second transistor switches are non-conductive and the third transistor switch is conductive and wherein in the amplify state, the first, second and third transistor switches are non-conductive.

11. The amplifier circuit of claim 10 wherein the switch controller operates to switch the amplifier to initialize state, then to the reset state and then to the amplify state.

12. The amplifier circuit of claim 10 further including a second capacitor coupled between the input and output of the first amplifier stage and a third capacitor coupled between the input and the output of the second amplifier stage.

13. The amplifier circuit of claim 12 further including a fourth capacitor coupled between the input of the first amplifier stage and a second node.

14. The amplifier circuit of claim 13 further including a first and second signal sources, a fourth transistor switch coupled between the second node and the first signal source and a fifth transistor switch coupled between the second node and the second signal source and wherein in the initialize state, the fourth switch is conductive and the fifth switch is non-conductive and in the amplify state, the fourth switch is non-conductive and the fifth switch is conductive.

15. The amplifier circuit of claim 14 wherein the fifth transistor switch is conductive and the fourth transistor switch is non-conductive in the reset state.

16. The amplifier circuit of claim 13 further including first, second and third signal sources, a fourth transistor switch coupled between the second node and the first signal source, a fifth transistor switch coupled between the second node and the second signal source and a sixth transistor switch coupled between the third signal source and the second node and wherein reset state is referred to as a first reset state and wherein the switch controller is operable to switch the amplifier circuit from the amplify state, referred to as a first amplify state, to a second reset state, from the second reset state to a second amplify state and wherein in the initialize state, the fourth transistor switch is conductive and the fifth and sixth transistor switches are non-conductive, wherein the first amplify state the fifth transistor switch is conductive and the fourth and sixth transistor switches are non-conductive, wherein the second reset state, the first and second transistor switches are non-conductive and the third transistor switch is conductive and wherein in the second amplify state, the first, second, third, fourth and fifth transistor switches are non-conductive and the sixth switch is conductive.

17. The amplifier circuit of claim 10 further including a fourth transistor switch coupled between the output of the first amplifier stage and the first node and wherein in the initialize and amplify states the fourth switch is conductive and in the reset state the fourth switch in non-conductive.

18. An amplifier circuit having a reset capability, said circuit comprising;

a first amplifier stage having an input and an output;

a first signal source switchable between first and second different signal levels;

a first capacitor having a first terminal coupled to the first amplifier stage input and a second terminal coupled to the first signal source;

a first transistor switch coupled between the input and output of the first amplifier stage;

a second transistor switch coupled between the output of the first amplifier stage and the second terminal of the first capacitor; and a switch controller operable to switch the amplifier circuit to an initialize state when the first signal is at the first level and wherein the first transistor switch is conductive and the second transistor switch is non-conductive and to switch the amplifier to a reset state wherein the first transistor switch is non-conductive and the second transistor switch is conductive and to an amplify state when the first signal is at the second level wherein the first and second switches are non-conductive.

19. The amplifier circuit of claim 18 wherein the first signal source includes a second amplifier stage having an input and an output and a third transistor switch coupled between the input and the output of the second amplifier stage and wherein the third transistor switch is conductive in the initialize state and non-conductive in the amplify state.

* * * * *